United States Patent [19]

Pittman

[11] 4,099,601
[45] Jul. 11, 1978

[54] SOLENOID OPERATED CONE BRAKE

[75] Inventor: John B. Pittman, Tulsa, Okla.

[73] Assignee: Telex Computer Products, Inc., Tulsa, Okla.

[21] Appl. No.: 840,975

[22] Filed: Oct. 11, 1977

Related U.S. Application Data

[63] Continuation of Ser. No. 731,107, Oct. 8, 1976, abandoned.

[51] Int. Cl.² .......................................... F16D 55/02
[52] U.S. Cl. .................................. 188/163; 188/71.1; 188/72.1; 192/70.15; 192/84 A; 192/84 C; 242/75.4; 242/156.2
[58] Field of Search ..................... 188/72.1, 163, 71.1, 188/73.3; 192/70.15, 84 A, 84 C; 310/77; 242/156, 156.2, 75.4

[56] References Cited

U.S. PATENT DOCUMENTS 2,723,806   11/1955   Carter ................................ 242/75.4
3,878,922   4/1975   McCarthy ........................... 188/163

FOREIGN PATENT DOCUMENTS

A76,577   10/1961   France ............................. 242/156.2

Primary Examiner—George E. A. Halvosa
Attorney, Agent, or Firm—Head, Johnson & Chafin

[57] ABSTRACT

In an oscillograph, a roll of recording paper is supported on a rotatable shaft such that the strip of recording paper passes over a metering roller driven at constant speed by a drive motor. Means to brake the shaft and prevent overrun of the recording strip comprises a magnetic solenoid-operated cone brake, adapted to momentarily place braking effort to the shaft. The cone brake has an appropriate friction liner, and serves to stop the roll, and prevent overrun. The braking effect is controlled by an electrical circuit that provides braking current to the solenoid for a selected short interval of time, sufficient to brake and stop the roll. At other times, there is no power applied to the brake.

2 Claims, 3 Drawing Figures

SOLENOID OPERATED CONE BRAKE

This is a continuation application of Ser. No. 731,107, filed Oct. 8, 1976, now abandoned.

BACKGROUND OF THE INVENTION

The invention lied in the field of oscillographic or others types of data recorders.

More particularly, this invention lies in the field of braking devices for large rolls of recording medium used in oscillographs and other types of data recorders.

Still more particularly, this invention comprises an improved type of cone brake for quickly stopping a heavy roll of recording medium that has been turning at a selected angular velocity.

In the prior art, the principal means for preventing the overrun of a large heavy roll of recording paper or other recording medium in oscillographs or other types of data recorders, has been to provide a spring controlled arm pressed against the shaft, or the outer surface of the roll of paper, such that when the power is removed from the drive motor, the friction of the arm against the outer surface of the roll will be sufficient to stop the roll within a short angular rotation, and prevent overrun and tangling of the recording medium. Such friction arms have a serious disadvantage in that they provide a continuing braking effort at all times while the roll is being purposely turned. This is a source of power drain and required a higher powered motor to drive the recording system.

It is therefore the primary object of this invention to provide a simple and inexpensive brake that can be applied to a recording device, that will apply a braking effort to the shaft carrying the roll of recording medium, so as to stop the rotation of the shaft and the roll, and prevent overruning.

It is a further object of this invention to provide a type of braking effort that is controlled for a selected short period of time and that is applied simultaneously with the removal of the driving power to the recording system.

SUMMARY OF THE INVENTION

These and other objects are realized and the limitations of the prior art are overcome in this invention by providing a cone brake, the male part of which, is attached to the shaft which supports the roll of unused recording medium, and a matching female conical part, which is supported coaxially with the male part, and is adapted to be restrained from rotation. The female part is supported by a short shaft coaxial with the axis of the brake that is supported by a magnetic solenoid device, such as a "LEDEX" drive. This solenoid is adapted to extend outwardly a short shaft, upon application of power to the winding of the solenoid. The extension of the shaft causing the female part of the brake to move axially, against restraining springs, to apply a braking torque to the shaft carrying the roll of recording medium.

Switching means are provided, responsive to the opening of the switch which controls the drive motor for the recording device, that simultaneously closes a second switch that applies a voltage from a power source to the "LEDEX" type solenoid. The power source is designed so as to apply current to the "LEDEX" solenoid for a selected short time, immediately after the power to the drive motor has been removed. The time interval is long enough to insure that the shaft supporting the role of recording medium is stopped. This also stops the metering roller and the drive motor of the oscillograph.

BRIEF DESCRIPTION OF THE DRAWINGS

These and other objects advantages of this invention and a better understanding of the principals and details of the invention will be evident from the following description taken in conjunction with the appended drawings in which.

DESCRIPTION OF THE PREFERRED EMBODIMENT

Figure 2:
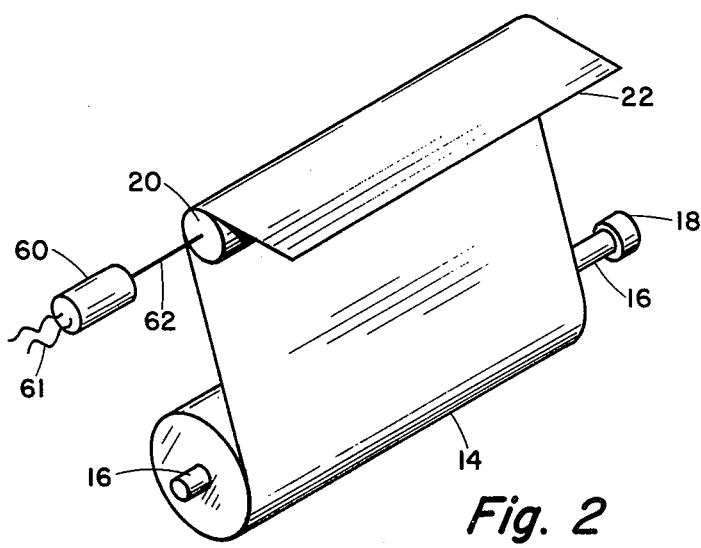
FIG. 2 illustrates schematically the movement of the recording medium in the recording device.
Figure 1:
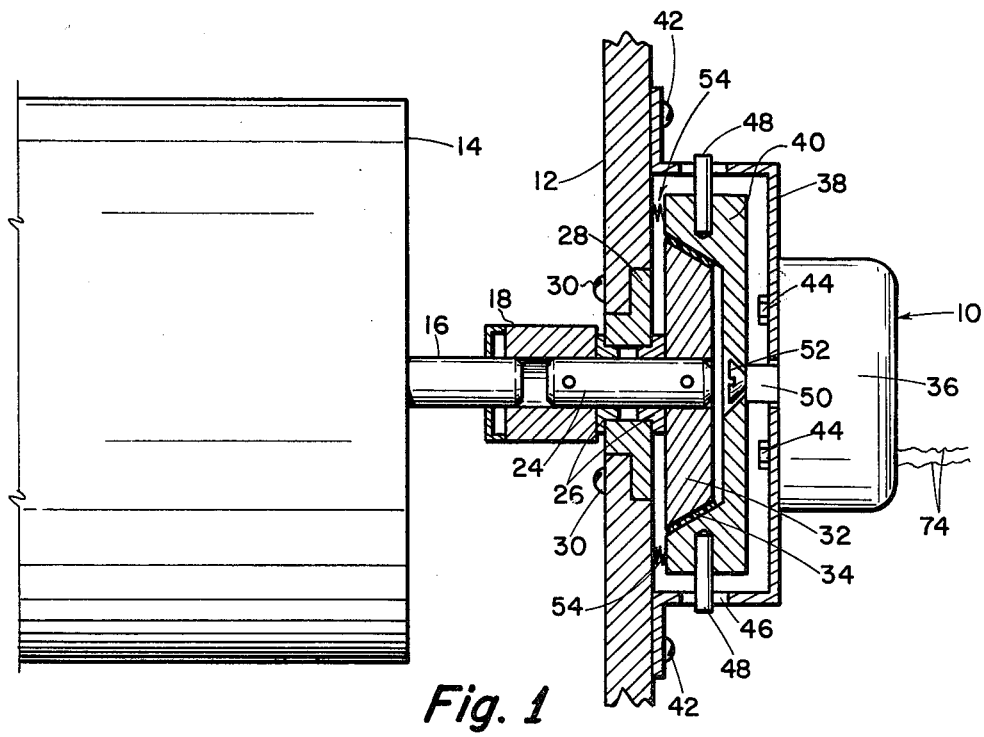
FIG. 1 illustrates in cross-section embodiment of this invention applied to an osicllograph type of recorder.

Referring now to the drawings and in particular to FIGS. 1 and 2, there is shown one embodiment of this invention indicated generally by the numeral 10. This braking system is attached to a wall of a recording oscillograph, or other data recorder, which carries a large roll of recording medium 14, which may be paper, photographic film, etc. While the recording medium may be of various types depending on the type of data recorder, for simplicity the invention will be described in terms of a roll of paper, which may be plain paper or graphic paper. Such a roll is indicated in FIG. 2 by the numeral 14, supported on a shaft 16. The paper sheet or strip 22 unrolls from the outer surface of the roll 14, and passes over a metering roller 20, which is normally driven at constant speed by a motor 60 through a drive means 62, which are well known in the art. Power is supplied to the motor by means of leads 61 which will be described later in connection with FIG. 3.

Referring now to FIG. 1, the shaft 16 which carries the roll of paper 14 would normally be journalled in a bearing in the wall 12. In applying the brake of this invention, a short shaft 24 is provided in bearings 26, which are part of a removable plate 28, which is adapted to be fitted into, and attached to the wall 12 by means of screws 30. Attached to the shaft 24 is a coupling 18, which, when the plate 28 is inserted into the wall 12, slides over the end of the shaft 16, and can apply a torque to the shaft 16. The other end of the shaft 24 carries a conical male portion of the brake 32. Part 32 can be made of metal such as aluminum, or plastic, etc. This has a layer of friction material 34 which conveniently can be cork or similar material, which has a sufficiently high co-efficient of friction.

There is mating femal portion 40 of the brake, which has an inner conical surface, which matches that of the part 32, and is supported coaxially with the part 32 on a shaft stub 50 which is part of a "LEDEX" type of solenoid 36.

The "LEDEX" solenoid is a well known device available on the market, which comprises a magnetic assembly, circular in construction, adapted to be mounted to a wall or plate and carrying a coaxial shaft extension. On application of current to the "LEDEX" solenoid 36, by means of leads 74, the stub shafts 50 will move outwardly (to the left in FIG. 1) from the solenoid. The shaft stub 50 carries the female portion 40 of the brake, which is attached by means such as the screw 52.

There are plurality of compression springs 54 which are attached either to the wall 12 or the part 40, so as to keep the part 40 spaced from the wall sufficiently, so as to provide clearance between the friction surface 34 and the inner surface of the part 40. It is only when the shaft 50 is pushed outwardly from the solenoid 36, on application of current to the winding 74, that the female part of the brake 40 moves to the left, compressing the springs 54 and applying a restraining torque to the rotating shaft 24, causing it to be brought to rest, and with it the shaft 16 and the paper roll 14. As soon as the current flow to the leads 74 stops, the magnetic push of the solenoid through shaft 50 ceases and the springs 54 then cause the part 40 to be moved back, to the right, out of contact with the friction surface 34. The shaft 16 is then free to rotate the next time that power is applied to the motor 60 at the meeting roller.

The "LEDEX" solenoid 10 is attached, by means of nuts 44 to a bracket 38 which is attached by screws 42 to the wall 12. There are two slots 46 in the bracket and pins are positioned in the female portion 40 which slide freely in the slots, permitting the part 40 to move axially but not to rotate more than a small clearance dimension between the pins and the slots.

The brake of this invention is either all on, or all off, depending on the energization of the solenoid 36.

There are a number of ways in which power can be applied to the solenoid for a selected length of time, such as by the use of timing circuit, or by a condenser discharge, or other means.

Figure 3:
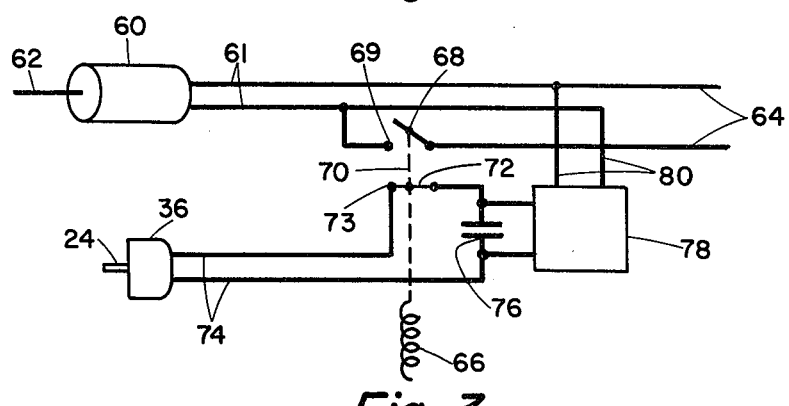
FIG. 3 illustrates one type of electrical control circuit for the drive motor and the braking solenoid.

FIG. 3 illustrates one type of control circuit which might be used to control the solenoid 10 and the drive motor 60 of the oscillograph, which drives the metering roller through the shaft 62. Power is supplied through the leads 64. This can be high or low voltage DC or AC as appropriate to the drive motor. A switch 68 is supplied to control the flow of current to the leads 61 to the drive motor 60. The switch 68 can be driven by a relay 66, or by manual means. Preferably, if a relay is used, an additional switch member 72 will be driven by the same means 70 of the relay, so that when the power switch 68 is opened to stop the drive motor 60, the switch member 72 will be closed to the contract 73, and will apply to the solenoid 36 through leads 74, the voltage on a capacitor 76, which has previously been charged to a selected voltage.

When the switch member 72 is closed, the capacitor discharges through the solenoid 36 applying the brake member 40 to the rotating member 32, and quickly slowing it and stopping it, and with it the shaft 16 and the roll of paper 14. The braking effort remains only as long as the capacitor retains charge. Therefore, after a selected interval of time, depending on the time constant of the capacitor and the coil of the solenoid, the braking effort is removed.

The solenoid 36 is supplied with power from the capacitor 76 which is charged by means of a charging device 78. This can be a transformer and rectifier, supplied with voltage from the source 64 by means of leads 80, or other means. So long as the switch 68 is closed, the power supply 78 keeps the capacitor 76 charged so that it is ready at the instant of opening of switch 68 to apply voltage to the solenoid 36.

The principal advantages of this type of brake system and control is that the conical surface of the two brake portions are self-aligning, and provide an improved braking surface as compared to the use of drum or disc brakes. Furthermore, the simplicity of the solenoid type of brake activator, makes it a useful, simple and inexpensive means for controlling the overrun of a large heavy roll of recording paper.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed:

1. An electrically actuated brake for controlling a shaft mounted roll of recording medium, comprising:
    a wall having a bearing therein, the bearing receiving and rotatably supporting said shaft extending from the roll and through the bearing;
    a brake first portion in the form of a disc having a truncated conical braking surface theron, the brake first portion being coaxially received on said shaft on the side of said wall opposite said roll;
    a bracket mounted on said wall on the side opposite said roll, the bracket being parallel said wall and of length greater than the diameter of said brake first portion, and having an opening therein coaxial with said brake first portion, the bracket having integral opposed leg portion extending to said wall and to either side of said brake first portion, each bracket leg portion having a longitudinal slot therein perpendicular to said wall;
    a brake second portion positioned between said bracket and said brake first portion and between said bracket legs and having on the forward surface a recess therein defining a frustro-conical braking surface matching said brake first portion braking surface and having on the rearward surface a shaft exending coaxially of said frustro-conical recess, the shaft being slidably received in said opening in said bracket, the brake second portion having a pair of opposed radially extending pins, each pin being slidably received in a said slot in a said bracket leg portion whereby said brake second portion is displaceable axially towards and away from said brake first portion but is non-rotatable; and
    a solenoid affixed to said bracket on the side thereof opposite said brake first portion, said solenoid receiving said shaft and arranged to axially displace said shaft to thereby move said brake second portion towards said brake first portion whereby the braking surfaces of each such components engage each other to stop the rotation of said roll or to move said brake second portion away from said brake first portion to permit the free rotation of said roll; and
    spring means urging said brake second portion away from said brake first portion.

2. An electrically actuated brake according to claim 1 including;
    a frictional material affixed to one of said first and second brake portion braking surfaces.

* * * * *